US012094515B2

(12) United States Patent
Van Der Veen et al.

(10) Patent No.: US 12,094,515 B2
(45) Date of Patent: Sep. 17, 2024

(54) DYNAMIC RANDOM ACCESS MEMORY (DRAM) ROW HAMMERING MITIGATION

(71) Applicant: QUALCOMM INCORPORATED, San Diego, CA (US)

(72) Inventors: Victor Van Der Veen, Leusden (NL); Pankaj Deshmukh, San Diego, CA (US); Behnam Dashtipour, San Diego, CA (US); David Hartley, Berlin (DE); Mosaddiq Saifuddin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 182 days.

(21) Appl. No.: 17/890,022

(22) Filed: Aug. 17, 2022

(65) Prior Publication Data

US 2024/0062800 A1    Feb. 22, 2024

(51) Int. Cl.
*G11C 7/00* (2006.01)
*G11C 11/406* (2006.01)
*G11C 11/4096* (2006.01)

(52) U.S. Cl.
CPC .. *G11C 11/40618* (2013.01); *G11C 11/40615* (2013.01); *G11C 11/4096* (2013.01)

(58) Field of Classification Search
CPC ................................. G11C 11/40618
USPC ....................................... 365/222
See application file for complete search history.

(56) References Cited

U.S. PATENT DOCUMENTS

| | | | |
|---|---|---|---|
| 2015/0089183 A1 | 3/2015 | Bains et al. | |
| 2020/0111525 A1 | 4/2020 | Cowles et al. | |
| 2021/0374006 A1 | 12/2021 | Wang et al. | |
| 2023/0170008 A1* | 6/2023 | Zhang | G11C 11/4078 365/222 |
| 2023/0385206 A1* | 11/2023 | Agarwal | G06F 12/1458 |

OTHER PUBLICATIONS

Abdullah Giray Ya et al.—"Security Analysis of the Silver Bullet Technique for Rowhammer Prevention." arxiv.org, Cornell University Library, 201 Olin Library, Cornell University, Ithaca, NY 14853, Jun. 13, 2021, XP081989286, 41 pages.
Related PCT Pat. App. Ser. No. PCT/US2023/028174, Victor Van Der Veen et al., filed Jul. 19, 2023, title: Dynamic Random Access Memory (DRAM) Row Hammering Mitigation, International Search Report (ISR)(ISA = EPO) of Oct. 26, 2023, 12 Pages, Published as WIPO Pub. App. No. WO2024-039486A1.

* cited by examiner

*Primary Examiner* — Hoai V Ho
(74) *Attorney, Agent, or Firm* — Smith Tempel Blaha LLC

(57) ABSTRACT

An effect known as "rowhammer" may be mitigated in a DRAM organized in sub-banks of two or more rows. Row activation commands directed to a sub-bank may be detected. The number of row activation commands occurring within a refresh window may be counted and compared with a threshold. When it is detected that the number of row activation commands within the refresh window exceeds the threshold, an additional refresh command may be provided to the DRAM.

26 Claims, 12 Drawing Sheets

DYNAMIC RANDOM ACCESS MEMORY (DRAM) ROW HAMMERING MITIGATION

DESCRIPTION OF THE RELATED ART

Dynamic random access memory ("DRAM") may be included in a wide variety of computing devices. Maintaining data integrity in DRAM is an important consideration.

It has been observed that repeatedly activating one or more rows of a DRAM array within a single refresh window may compromise data integrity, i.e., may result in corruption of stored data. Repeatedly activating one or more rows of a DRAM array may cause one or more cells of a physically adjacent row to leak its stored electrical charge, resulting in an increased probability of a bit flip. This phenomenon is commonly referred to as "row hammering" or "rowhammer," and may be exploited by an attacker to intentionally corrupt stored data.

A number of rowhammer mitigation methods have been developed. Some rowhammer mitigation methods may throttle or limit row activation rates when rapid row activations are detected. Other rowhammer mitigation methods may refresh potential victim rows when rapid row activations are detected. Rowhammer mitigation methods may count the number of row activations occurring within a refresh window. A threshold number of row activations, above which the probability of a bit flip is deemed unacceptably high, may be determined, and mitigation may be applied when the count of row activations reaches the threshold. It would be desirable to improve rowhammer mitigation.

SUMMARY OF THE DISCLOSURE

Systems, methods, memory controllers, and other examples are disclosed for mitigating row hammering in a dynamic random access memory (DRAM) system.

An exemplary method may include detecting row activation commands directed to a sub-bank of a DRAM. A DRAM array or bank may be organized as two or more sub-banks, where each sub-bank may comprise two or more rows of the bank. The exemplary method may also include counting the number of row activation commands occurring within a window between a first refresh command and a second refresh command. The exemplary method may further include comparing the counted number of row activation commands with a first threshold. The exemplary method may still further include providing an additional refresh command to the DRAM array within the window in response to detecting that the counted number of row activation commands exceeds the first threshold.

A system for mitigating row hammering may include command detection logic configured to detect row activation commands directed to a sub-bank of a DRAM. The system may also include activation command counting logic configured to count the number of row activation commands occurring within a window between a first refresh command and a second refresh command. The activation command counting logic may also be configured to compare the counted number of row activation commands with a threshold. The system may further include an additional refresh command generator configured to provide an additional refresh command to the DRAM array within the window in response to detecting the first number of row activation commands exceeds the first threshold.

Another exemplary system for mitigating row hammering may include means for detecting row activation commands directed to a sub-bank of a DRAM. The exemplary system may also include means for counting the number of row activation commands occurring within a window between a first refresh command and a second refresh command and for comparing the counted number of row activation commands with a threshold. The exemplary system may further include means for providing an additional refresh command to the DRAM array within the window in response to detecting that the counted number of row activation commands exceeds the first threshold.

An exemplary memory controller may include command generator logic configured to generate DRAM commands in response to memory transaction requests. The DRAM commands may include row activation commands and refresh commands. The exemplary memory controller may also include command detection logic configured to detect row activation commands directed to a sub-bank of a DRAM. The exemplary memory controller may further include activation command counting logic configured to count the number of the row activation commands occurring within a window between a first refresh command and a second refresh command. The activation command counting logic may also be configured to compare the counted number of row activation commands with a threshold. The exemplary memory controller may still further include an additional refresh command generator configured to provide an additional refresh command to the DRAM array within the window in response to detecting the first number of row activation commands exceeds the first threshold.

BRIEF DESCRIPTION OF THE DRAWINGS

In the Figures, like reference numerals refer to like parts throughout the various views unless otherwise indicated. For reference numerals with letter character designations such as "101A" or "101B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Figure 1:
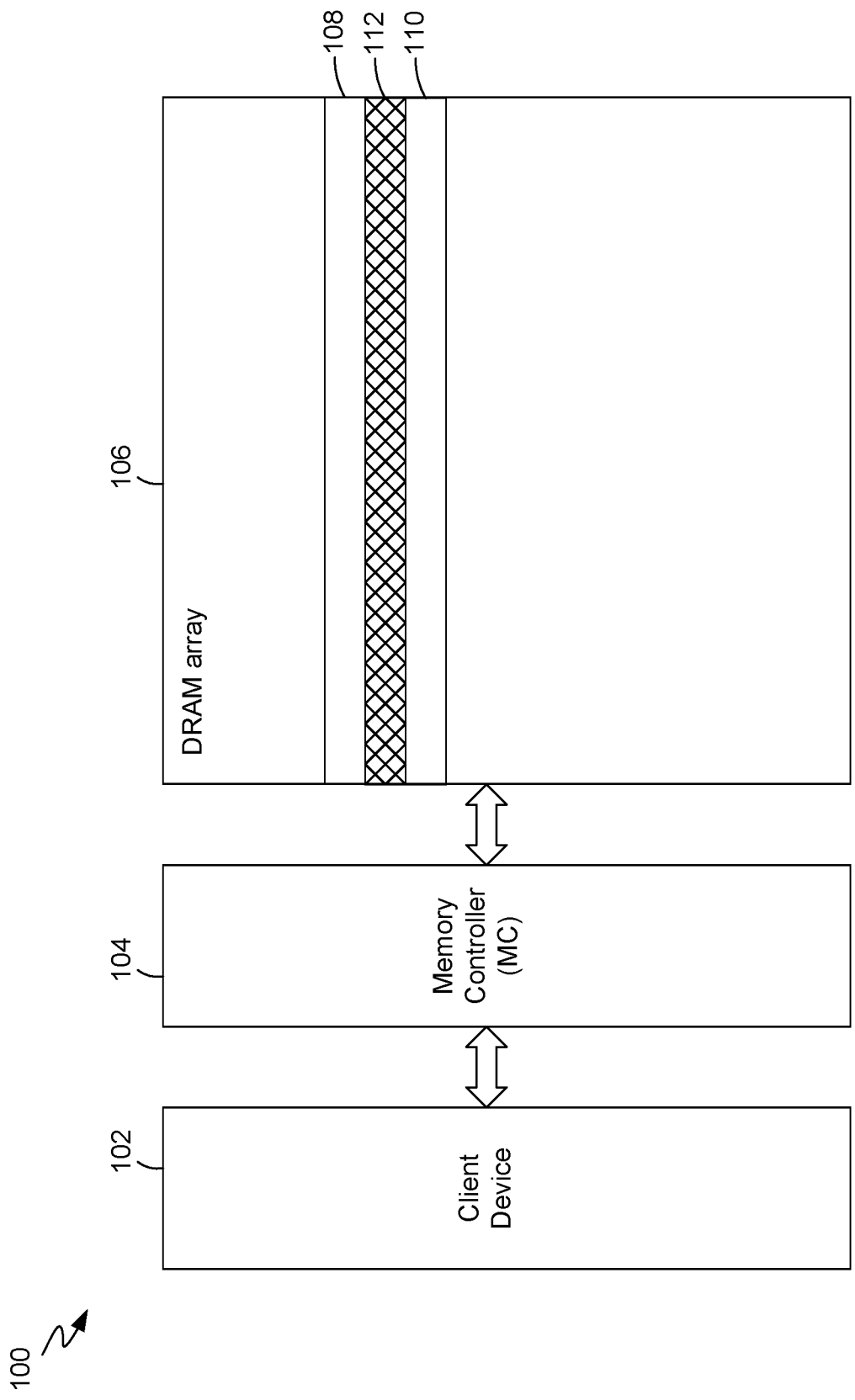
FIG. 1 is a block diagram of a DRAM system and a client device, in accordance with exemplary embodiments.

As shown in FIG. 1, in an illustrative or exemplary embodiment a system 100 may include a client device 102, a memory controller 104, and one or more dynamic random access memory ("DRAM") arrays 106. As described below, the memory controller 104 or, alternatively or in addition, the DRAM arrays 106, may include features to mitigate the effects of the phenomenon commonly known as "rowhammer."

Rowhammer is a disturbance error that may result in corruption of data stored in the DRAM array 106. Repeatedly activating one or more rows 108, 110, etc., may cause the stored electrical charge in a cell (not individually shown in FIG. 1) of another row 112 that is physically proximate to the one or more rows 108, 110, etc., to leak that charge, increasing the probability of a bit flip. That is, as a result of a rowhammer attack, there may be an increased probability that a bit value read from a cell is different from the bit value that was originally stored in the cell. More specifically, a "1" that was stored before the rowhammer attack may be erroneously read as a "0" after the rowhammer attack, or a "0" that was stored before the rowhammer attack may be erroneously read as a "1" after the rowhammer attack. The rows 108, 110, etc., may be referred to as "aggressor" rows, and the row 112 (indicated in cross-hatch in FIG. 1 for emphasis) may be referred to as a "victim" row. In the illustrated example, the victim row 112 is immediately adjacent each of the aggressor rows 108 and 110. In other examples of rowhammer attacks, such a victim row may be adjacent to only one aggressor row. Although only three rows 108, 110 and 112 are shown for purposes of example, the DRAM array 106 may have any number of rows, such as, for example, 16 k, 32 k, etc., as understood by one of ordinary skill in the art.

Figure 2:
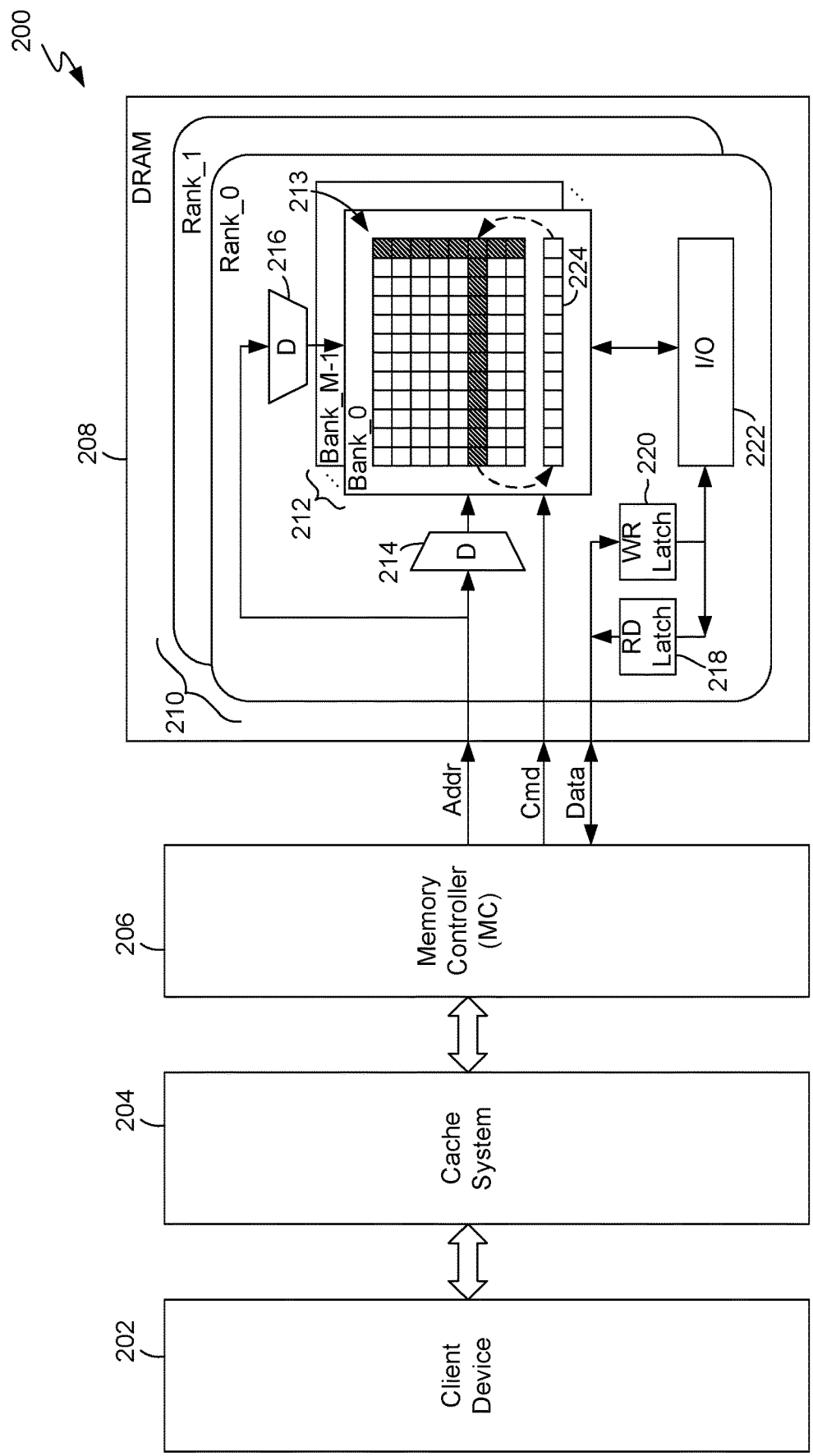
FIG. 2 is a block diagram similar to FIG. 1, showing DRAM features, in accordance with exemplary embodiments.

As illustrated in FIG. 2, a system 200 may include a client device 202, a cache system 204, a memory controller 206, and a DRAM 208. Some or all of these elements may be included in a "system-on-a-chip" or "SoC" that includes one or more types of processors, such as central processing units ("CPU"s), graphics processing units ("GPU"s), digital signal processors ("DSP"s), neural processing units ("NPU"s), etc. The client device 202 may, for example, be implemented in a CPU (not separately shown) or application processor. Although not shown in FIG. 2 for purposes of clarity, the system 200 may be included in a computing device, such as, for example, a portable computing device. The system 200 may be an example of the above-described system 100 (FIG. 1).

The client device 202 may issue DRAM transaction requests that may include read requests, i.e., requests to read data from the DRAM 208, and write requests, i.e., requests to store data in the DRAM 208. The DRAM transaction requests may also be referred to as requests to access the DRAM 208. Each DRAM transaction request may include a target address in the DRAM 208, a size or amount of data to be accessed, and other information. A write request also includes the data, which may be referred to as a payload, that the memory controller 206 is to store in the DRAM 208 in response to the write request.

But for the features described herein with regard to rowhammer mitigation, the structure and operation of the memory controller 206 and DRAM 208 are well understood by one of ordinary skill in the art. Nevertheless, the following brief description is provided as background.

The memory controller 206 may, among other functions, translate the transaction requests into DRAM commands ("Cmd") and physical DRAM addresses ("Addr") and provide the commands and addresses to the DRAM 208. The memory controller 206 may queue the transaction requests and, using a scheduling algorithm, provide the associated commands and addresses to the DRAM 208 in a determined order. In providing the commands and addresses to the DRAM 208, the memory controller 206 may control the timing of such commands and addresses with respect to one another. As such aspects are well understood by one of ordinary skill in the art, they are not described in further detail herein.

The DRAM 208 may be of any type not inconsistent with the descriptions herein. For example, the DRAM 208 may be a double data rate synchronous DRAM ("DDR-SDRAM"), sometimes referred to for brevity as "DDR." As DDR technology has evolved, DDR versions such as fourth generation low-power DDR ("LPDDR4") and fifth generation low-power DDR ("LPDDR5") have been developed. The DRAM 208 may comprise, for example, LPDDR4, LPDDR4X, LPDDR5, LPDDR5X, etc. Still other types of DDR include graphics DDR ("GDDR"). Although the DRAM 208 may be DDR in the examples described herein, in other examples such a DRAM could be another type of low power DRAM, such as the SDRAM in a High Bandwidth Memory ("HBM").

The DRAM 208 may comprise two ranks 210, which may be referred to as Rank_0 and Rank_1. Although two ranks 210 are shown in this example, in other examples there may be only one rank or more than two ranks. As the two ranks 210 are identical to each other, the following description applies to each rank 210. A rank 210 comprises two or more ("M") banks 212, which may be referred to as Bank_0 through Bank_M-1. Each bank 212 is organized as a two-dimensional array 213 of cells or storage locations, where the storage locations in the array 213 are accessed by selecting rows and columns. A cell's electrical charge represents a stored data value, i.e., a "1" or a "0". The array 213 may be an example of the array 106 shown in a more conceptual form in FIG. 1. The array 213 may have any number of rows, such as, for example, 16 k, 32 k, etc.

An exemplary row and an exemplary column of an array 213 are highlighted in cross-hatch in FIG. 2 for purposes of illustration. A row may also be referred to as a wordline in some examples. Also, although not illustrated in FIG. 2 for purposes of clarity, the DRAM 208 may further be organized in bank groups. For example, each rank 210 may consist of four bank groups (not shown), and each of those bank groups may consist of four banks. In such an example the DRAM 208 therefore consists of 32 distinct (i.e., individually addressable) banks 212. Although in the example illustrated in FIG. 2 the DRAM 208 has two ranks 210, each having four bank groups, and each of the four bank groups has four banks 212, in other examples such a DRAM may be organized in any other way, including more or fewer ranks, banks, bank groups, etc., than in the illustrated example.

The physical addresses by which the memory controller 206 accesses the DRAM 208 may include row addresses, column addresses, bank group addresses, and bank addresses. Also, although not shown for purposes of clarity, in response to a rank address (e.g., a chip select bit included in the read or write command) provided by the memory controller 206, rank address decoding logic may select one of the ranks 210. Although likewise not shown for purposes of clarity, in response to a bank address provided by the memory controller 206, bank address decoding logic may select one of the banks 212 in a selected bank group of a selected rank 210. In response to a row address provided by the memory controller 206, a row address decoder 214 may select one of the rows in a selected bank 212 of a selected bank group in a selected rank 210. Similarly, in response to a column address provided by the memory controller 206, a column address decoder 216 may select one of the columns in a selected bank 212 of a selected bank group in a selected rank 210. Sequential row addresses may correspond to sequential row physical locations. That is, a row having an address X+1 may be physically adjacent to a row having an address X, and a row having an address X−1 may similarly be physically adjacent to the row having the address X. In the example described above with regard to FIG. 1, the victim row 112 may have the address X, and the aggressor rows 108 and 110 may have the addresses X+1 and X−1. Sequential row addresses do not necessarily correspond to sequential row physical locations in all DRAMs, but such an example is shown in FIG. 1 to more clearly illustrate the rowhammer principle.

Each rank 210 may have a read latch 218 to buffer the read data, and a write latch 220 to buffer the write data. Each rank 210 may also have input/output ("I/O") logic 222 configured to direct the read and write data from and to selected memory locations.

Each bank 212 may have a row buffer 224. The row buffer 224 stores the contents of the selected row. A row must be selected or "opened" before it may be written to or read from. The DRAM 208 opens a row, i.e., stores the contents of that row in the row buffer 224, in response to an activate ("ACT") command. Once a row is opened, the DRAM 208 may read from or write to any number of columns in the row buffer 224 in response to read or write commands, also referred to as column address select ("CAS") commands. Following a read or write command, the data is transferred serially between the memory controller 206 and DRAM 208 in units known as a "burst," which may be, for example, eight bits per data signal line. The row must be restored or "closed" after writing to or reading from the row buffer 224. The DRAM 208 closes a row in response to a pre-charge ("PRE") command.

In translating a read request or write request, the memory controller 206 determines a sequence and timing of one or more commands needed to fulfill the request. The memory controller 206 also performs periodic refresh operations on all rows in all banks 212 of both ranks 210 to maintain data integrity, and there are commands associated with such refresh operations, such as, for example, a per-bank refresh ("PBR") command.

A "refresh window" refers to a fixed amount of time ("tREFW") within which all rows of a bank 212 must receive refresh operations to maintain data integrity. Within each refresh window, a fixed number of refresh operations, such as, for example, 8192 (i.e., 8 k) PBR operations, must be performed to refresh all rows of the bank 212. That is, in such an example all rows in a bank 212 have been refreshed after 8192 PBR operations have been performed. The refresh window may be referred to as a sliding window because while its length, tREFW, is fixed, the refresh window may occur at any time with respect to other DRAM-related signals.

As noted above, within each refresh window there may be a threshold number of activations of an aggressor row above which the probability of a bit flip in a victim row is deemed unacceptably high. This threshold number of activations may be determined empirically and may vary depending upon factors such as the physical distance between adjacent rows, semiconductor process variation, temperature, etc. Similarly, a Maximum Activation Count ("MAC_bank") of a given bank 212 may be determined. MAC_bank is a threshold number of same-bank row activations above which the probability of a bit flip in a victim row of that bank exceeds a threshold. The probability of a bit flip will not exceed this probability threshold so long as fewer than MAC_bank+1 activations occur within the sliding refresh window (i.e., within tREFW). Stated conversely, the probability of a bit flip will exceed this threshold when an (MAC_bank+1)th activation occurs within tREFW. Therefore, a maximum or threshold number of same-bank row activations ("MAC_ref") can be defined, where MAC_ref is MAC_bank divided by the number of refresh operations required to refresh all rows of a bank 212. In an example in which 8192 refresh operations are required to refresh all rows of a bank 212, MAC_ref=MAC_bank/8192.

In accordance with one aspect of exemplary methods for mitigating row hammering, same-bank row activations may be throttled such that MAC_ref is never exceeded. The number of same-bank row activations within a refresh window may be counted and compared with a count threshold. For example, a counter may be incremented in response to each row activation command and reset in response to each refresh command.

Figure 3:
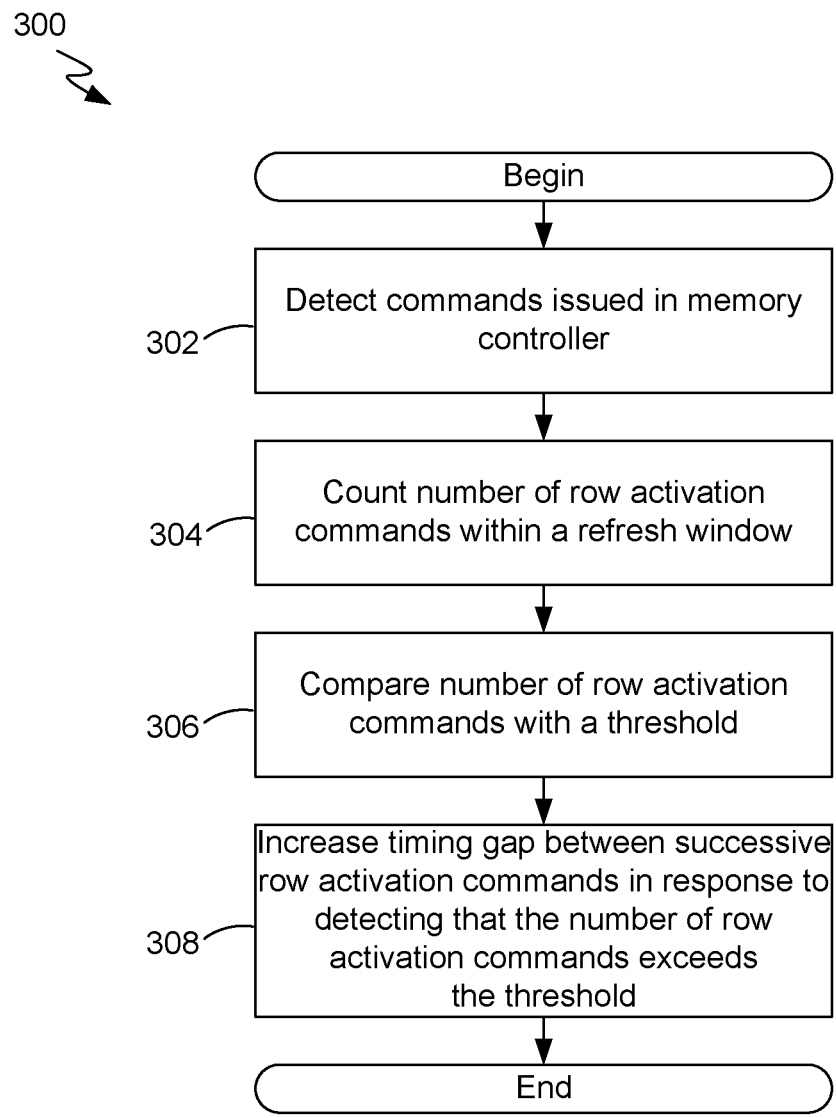
FIG. 3 is a flow diagram illustrating a method for rowhammer mitigation, in accordance with exemplary embodiments.

In FIG. 3 a method 300 is illustrated in flow diagram form. As indicated by block 302, the method 300 may include detecting row activation commands (e.g., "ACT") issued in the memory controller 206 (FIG. 2). In an embodiment in which the method 300 is performed in a memory controller, the row activation commands issued in the memory controller may also be detected in the memory controller. Nevertheless, in other embodiments the method 300 may be performed in another element, such as in the DRAM itself.

As indicated by block 304, the method 300 may include counting the number of the row activation commands occurring within a refresh window (i.e., between a first refresh command and a second refresh command). For clarity, the number of row activation commands in this instance of counting may also be referred to as a "first" number of row activation commands. The first and second refresh commands may be consecutive. That is, in such an example there are no intervening refresh commands between the first and second refresh commands. Alternatively, in other examples of the method 300 the first number of row activation commands may be the number of row activation commands counted between non-consecutive refresh commands.

As indicated by block 306, the method 300 may include comparing the first number of row activation commands with a threshold. For clarity, the threshold in this instance of comparing may also be referred to as a "first" threshold. As indicated by block 308, the method 300 may include increasing a timing gap between commands provided to a DRAM array in response to detecting that the first number of row activation commands exceeds the first threshold. For example, the timing gap between an ACT command and an associated CAS command may be increased.

In some examples, after increasing (block 308) the row activation timing gap a first time, the method 300 may be repeated one or more additional times in an iterative manner. For example, in accordance with block 304 a second number of row activation commands occurring within another refresh window between two other first and second refresh commands may be counted. In accordance with block 306, the sum of the first and second number of row activation commands may be compared with a second threshold. In accordance with block 308, the timing gap between some commands provided to the DRAM array may be further increased (i.e., to greater than the amount of time to which the timing gap was previously increased) in response to detecting that the sum of the first and second number of row activation commands exceeds the second threshold.

In an example of the method 300, within a first sequence of P activation commands, successive activation commands may be spaced from each other by a first time interval (i.e., timing gap), where P<MAC_ref. If after those P activation commands it is determined that the number of activation commands within a refresh window exceeded the first threshold, then within a second sequence of Q activation commands, successive activation commands may be spaced from each other by a second time interval that is greater than the first time interval, where P+Q⇐MAC_ref. If after those Q activation commands it is determined that the number of activation commands within a refresh window exceeded the second threshold, then within a third sequence of R activation commands successive activation commands may be spaced from each other by a third time interval that is greater than the second time interval, where P+Q+R⇐MAC_ref, etc.

Figure 4:
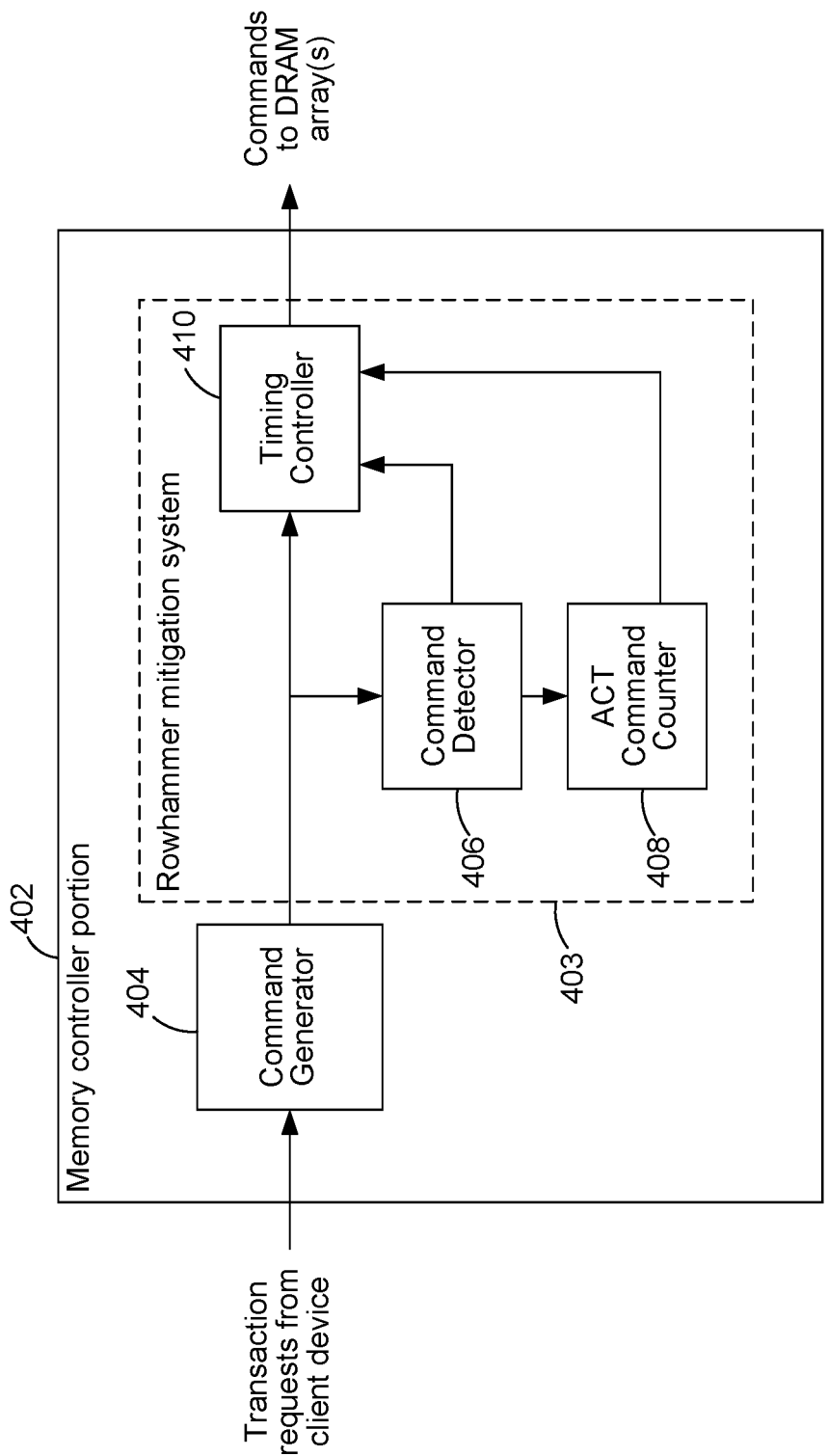
FIG. 4 is a block diagram illustrating a rowhammer mitigation system in a memory controller, in accordance with exemplary embodiments.

In FIG. 4 a memory controller portion 402 that includes a rowhammer mitigation system 403 is illustrated in block diagram form. The memory controller portion 402 may be an example of a portion of the memory controller 104 (FIG. 1) or the memory controller 206 (FIG. 2). Only logic elements relevant to an exemplary rowhammer mitigation solution are shown in FIG. 4; other memory controller portions, such as some conventional memory controller logic, are not shown for purposes of clarity. It should be understood that the memory controllers 104 (FIG. 1) and 206 (FIG. 2) may be configured to operate in a conventional manner in addition to being configured to operate in accordance with the rowhammer mitigation solutions described herein. Such conventional memory controller operations and corresponding structural elements (i.e., hardware or other logic) are well understood by one of ordinary skill in the art and therefore may not be described in detail herein.

The memory controller portion 402 may include a command generator 404, which translates transaction requests from a client device (not shown in FIG. 4) into sequences of DRAM commands, including row activation commands. In addition to producing commands in response to transaction requests, the command generator 404 may produce periodic refresh commands. As such a command generator 404 is well understood by one of ordinary skill in the art, it is not described in further detail herein.

The rowhammer mitigation system 403 of the memory controller portion 402 may include a command detector 406. The command detector 406 may be configured to detect row activation ("ACT") commands and refresh commands produced by the command generator 404. The rowhammer mitigation system 403 may also include a row activation command counter 408 coupled to the command detector 406. The row activation command counter 408 may maintain a count of row activation commands and increment the count in response to each detection of a row activation command by the command detector 406. The activation command counter 408 may reset the count in response to each detection of a refresh command by the command detector 406. The row activation command counter 408 may compare the count with a threshold (number) and produce an indication when the count reaches the threshold.

The rowhammer mitigation system 403 may further include a timing controller 410. In the manner described above with regard to the method 300 (FIG. 3) the timing controller 410 may adjust (e.g., increase) the timing gap between commands provided from the memory controller to the DRAM array (not shown in FIG. 4) in response to indications from the row activation command counter 408 that the count has reached the threshold. As described above with regard to the method 300, increasing the timing gap between, for example, an ACT command and a corresponding CAS command may throttle or slow down accesses to the DRAM array. Note that while the command generator 404 and other logic (e.g., scheduling, pipelining, etc.) generally control the timing of commands sent to the DRAM array, the timing controller 410 may override or adjust that timing.

The rowhammer mitigation system 403 may include hardware logic, software logic, or any combination of both. For example, the rowhammer mitigation system 403 may include state machines, processor logic configured by software or firmware, etc., as understood by one of ordinary skill in the art. The rowhammer mitigation system 403 may be configured through such logic to perform or control the above-described method 300 (FIG. 3). Elements of the rowhammer mitigation system 403 may serve as means for performing or controlling aspects of the method 300.

In accordance with another aspect of exemplary methods for mitigating row hammering, an additional refresh command may be provided to a DRAM array when the number of same-bank row activations reaches a threshold. The "additional" refresh command may be in addition to the periodic refresh commands produced by the command generator 404. Alternatively, the "additional" refresh command may be provided by rescheduling a previously scheduled periodic refresh command to occur earlier.

Figure 5:
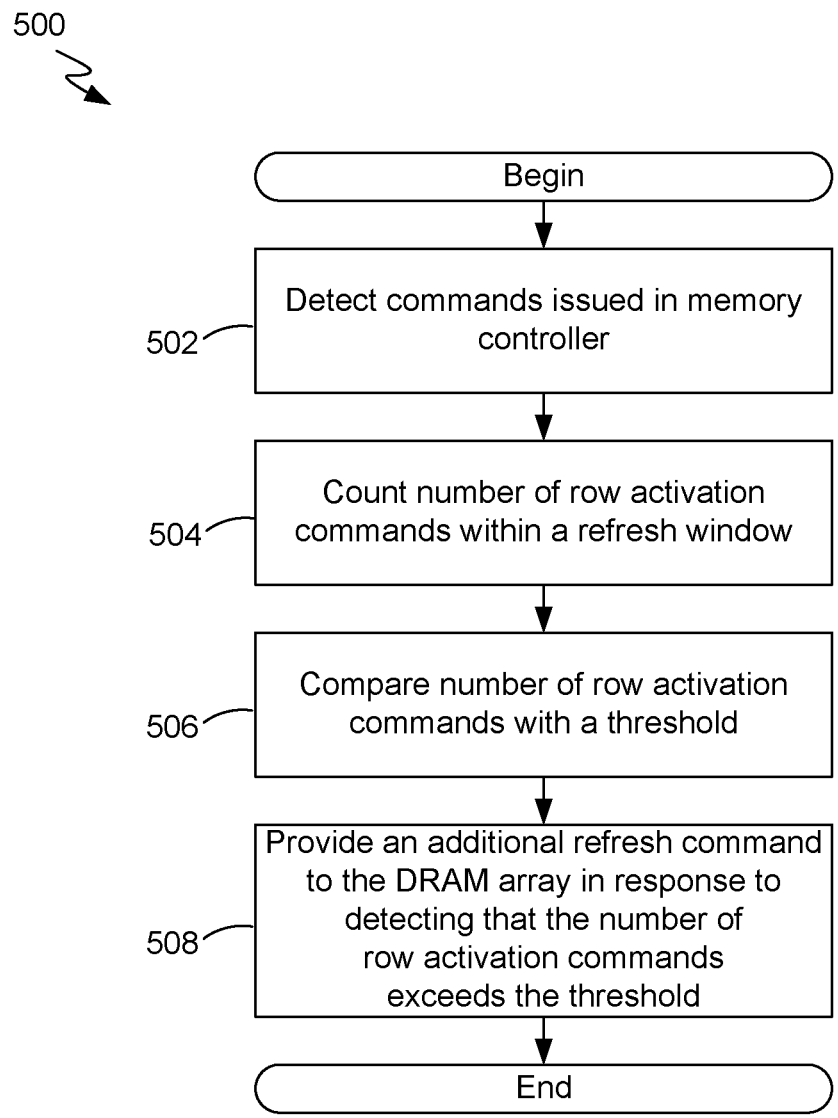
FIG. 5 is a flow diagram illustrating another method for rowhammer mitigation, in accordance with exemplary embodiments.

In FIG. 5 a method 500 is illustrated in flow diagram form. As indicated by block 502, the method 500 may include detecting row activation commands. In an embodiment in which the method 500 is performed in a memory controller, the row activation commands issued in the memory controller may also be detected in the memory controller. Nevertheless, in other embodiments the method 300 may be performed in another element, such as in the DRAM itself.

As indicated by block 504, the method 500 may include counting the number of row activation commands occurring within a refresh window (i.e., between a first refresh command and a second refresh command). The first and second refresh commands may be consecutive. Alternatively, in other examples of the method 500 the number of row activation commands between non-consecutive refresh commands may be counted.

As indicated by block 506, the method 500 may include comparing the counted number of row activation commands occurring within the refresh window with a threshold. As indicated by block 508, the method 500 may include providing an additional refresh command to the DRAM array in response to detecting that the counted number of row activation commands exceeds the threshold. Note that the additional refresh command is provided to the DRAM array within the refresh window, i.e., before the aforementioned second refresh command. Accordingly, rows in the DRAM array get refreshed earlier than they would have been had the count of the number of row activation commands not reached the threshold.

Figure 6:
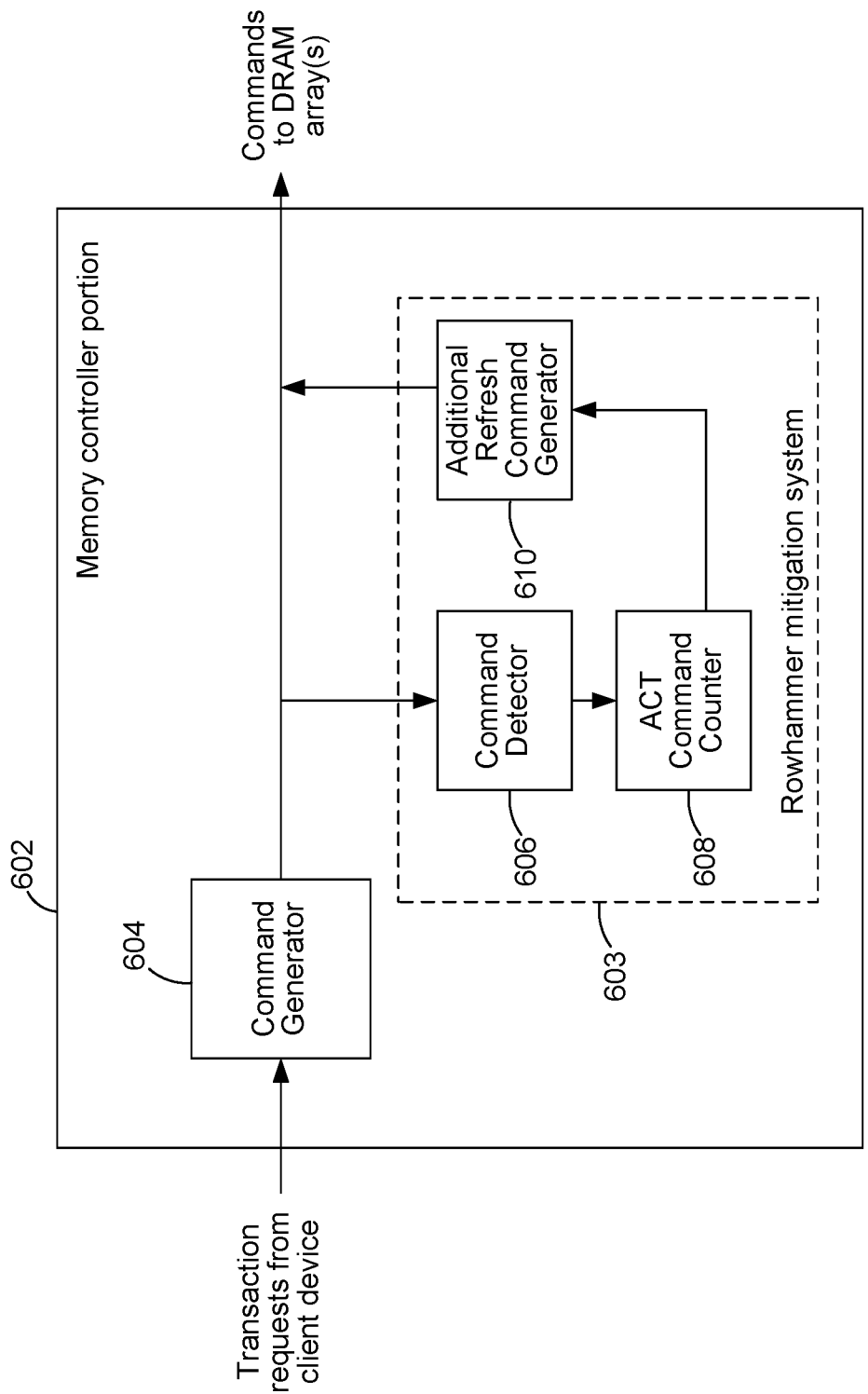
FIG. 6 is a block diagram illustrating another rowhammer mitigation system in a memory controller, in accordance with exemplary embodiments.

In FIG. 6 a memory controller portion 602 that includes a rowhammer mitigation system 603 is illustrated in block diagram form. The memory controller portion 602 may include a command generator 604, which may be similar to the above-described command generator 404 (FIG. 4). The rowhammer mitigation system 603 of the memory controller portion 602 may include a command detector 606 and a row activation command counter 608, which may be similar to the above-described command detector 406 and row activation command counter 408 (FIG. 4), respectively. The rowhammer mitigation system 603 may further include an additional refresh command generator 610. The additional refresh command generator 610 may provide additional refresh commands to the DRAM array (not shown in FIG. 6) in response to indications from the row activation command counter 608 that the count has reached the threshold. The row activation command counter 608 may reset the count each time the count reaches the threshold (and thus each time an additional refresh command is provided). Note that the row activation command counter 608 may reset the count each time any type of refresh command occurs, including refresh commands that occur on a periodic basis. In still other embodiments, a memory controller portion (not shown) may include both the timing controller 410 described above with regard to FIG. 4 and the additional refresh command generator 610 described above with regard to FIG. 6.

The rowhammer mitigation system 603 may include hardware logic, software logic, or any combination of both. For example, the rowhammer mitigation system 603 may include state machines, processor logic configured by software or firmware, etc., as understood by one of ordinary skill in the art. The rowhammer mitigation system 603 may be configured through such logic to perform or control the above-described method 500 (FIG. 5).

Although in the illustrated embodiments the above-described rowhammer mitigation systems 403 (FIG. 4) and 603 (FIG. 6) are included in respective memory controller portions 402 and 602, in other embodiments (not shown) such rowhammer mitigation systems may be included in the DRAM itself. In such other embodiments, the DRAM may be coupled with a conventional memory controller.

Figure 7:
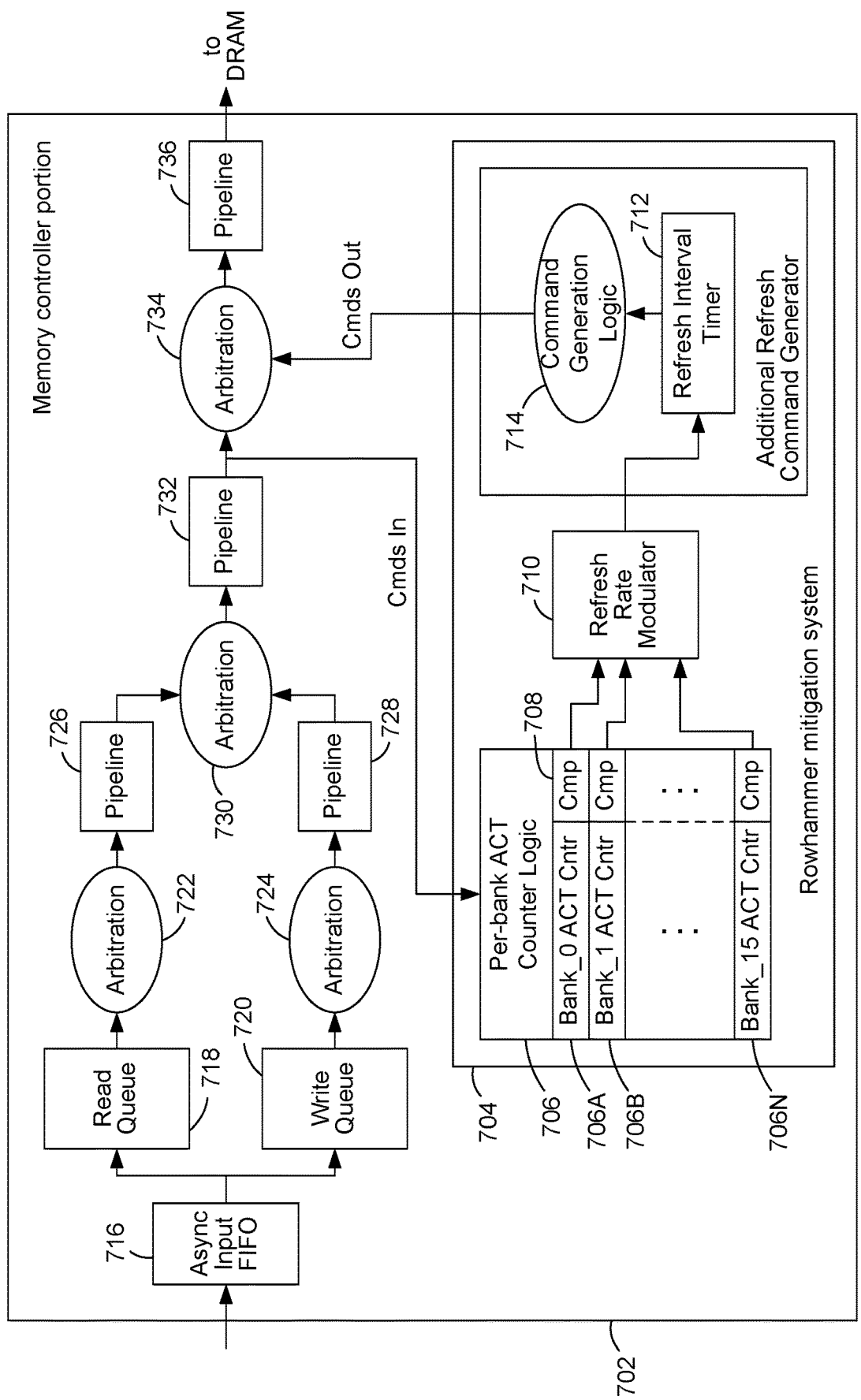
FIG. 7 is a block diagram illustrating a rowhammer mitigation system with arbitration and pipelining logic in a memory controller, in accordance with exemplary embodiments.

In FIG. 7 another example of a memory controller portion 702 is illustrated in block diagram form. Command generation aspects are not shown in FIG. 7 for purposes of clarity. Rather, the memory controller portion 702 illustrates an example of rowhammer mitigation system 704 along with arbitration and pipelining logic relating to the routing of DRAM commands to a DRAM (not shown) and to and from the rowhammer mitigation system 704.

The rowhammer mitigation system 704 may include per-bank ACT counter logic 706. As described below with regard to a feature referred to as sub-banks, in other examples such counter logic may count row activation commands per sub-bank instead of per bank. The ACT counter logic 706 may be configured to detect ACT (i.e., row activation) commands. A row activation command may be directed to any of the banks of the DRAM. The ACT counter logic 706 may include counters 706A, 706B, etc., through 706N, where the number of counters 706A-706N is equal to the number of banks of the DRAM. In the example shown in FIG. 7 there are 16 counters 706A-706N, corresponding to 16 DRAM banks (not shown). Nevertheless, in other examples there may be any number of such counters corresponding to any number of DRAM banks. The 16 counters 706A-706N may also be referenced in the illustrated example as a Bank_0 ACT counter through a Bank_15 ACT counter, respectively. Each counter 706A-706N maintains a count and increments the count when the ACT counter logic 706 detects a row activation command directed to the corresponding DRAM bank. The ACT counter logic 706 may include comparator logic 708 configured to compare the count with a threshold, i.e., a fixed number or constant.

Outputs of the comparator logic 708 may be coupled to a refresh rate modulator 710 and configured to provide an indication to the refresh rate modulator 710 when any of the counters 706 reach a count equal to the threshold. The refresh rate modulator 710 may be configured to detect whether any of the comparator logic 708 provides such an indication to the refresh rate modulator 710 and, if such an indication is detected, to temporarily increase the rate at which refresh commands are issued to the DRAM device. The refresh rate modulator 710 may be coupled to a refresh interval timer 712. The refresh rate modulator 710 may be configured to signal the refresh interval timer 712 that a different refresh rate applies. The refresh interval timer may be coupled to command generation logic 714, which may be configured to insert refresh commands into the command sequence given the programmed refresh rate. The refresh rate modulator 710 may further be configured to reset the refresh rate interval to its initial value when comparator logic 708 reports that no counter exceeds the programmed threshold. The command generation logic 714 may be configured to generate an additional refresh command. As described above, the additional refresh command is generated in addition to the refresh commands that are generated in a periodic manner (by a source not shown in FIG. 7).

The remaining logic shown in FIG. 7 relates to the routing of DRAM commands to and from the rowhammer mitigation system 704. An asynchronous input FIFO 716 may receive DRAM commands, including read-related DRAM commands and write-related DRAM commands (generated by a source not shown in FIG. 7). A read queue 718 and a write queue 720 may be coupled to the output of the asynchronous input FIFO 716. Commands relating to read requests and write requests are separately queued in the read queue 718 and write queue 720, respectively. Arbitration logic 722 and 724 may be coupled to the outputs of the read queue 718 and write queue 720, respectively. The arbitration logic 722 and 724 arbitrate the commands that are in read queue 718 and write queue 720, respectively, to determine what command to add next to pipeline 726 and 728, respectively, based on priority and schedulability. Pipeline logic 726 and 728 may be coupled to the outputs of the arbitration logic 722 and 724, respectively. The pipeline logic 726 and 728 may be configured to align the DRAM commands in time in relation to other signals and events. Further arbitration logic 730 may be coupled to the outputs of the pipeline logic 728 and 730 and configured to arbitrate between read-related commands and write-related commands. Further pipeline logic 732 may be coupled to the output of the arbitration logic 730.

The rowhammer mitigation system 704 may be configured to receive DRAM commands from the output of the pipeline logic 732. The per-bank ACT counter 706 of the rowhammer mitigation system 704 may be configured to detect ACT and refresh (i.e., PBR) commands. The output of the rowhammer mitigation system 704, which may include additional refresh commands that may be generated, may be coupled to still further arbitration logic 734. The output of the pipeline logic 732 may also be coupled to the arbitration logic 734. The arbitration logic 734 may be configured to arbitrate between the additional refresh commands generated by the rowhammer mitigation system 704 and the DRAM commands arriving from the source (not shown in FIG. 7) of read-related commands and write-related commands. In other words, the arbitration logic 734 forms a command stream combining the additional refresh commands and the read-related and write-related commands, such as ACT, CAS, etc. Yet further pipelining logic 736 may be coupled to the output of the arbitration logic 734. The output of the pipelining logic 736 may be coupled to the DRAM (not shown in FIG. 7). It should be understood that the above-described arrangement of various arbitration and pipelining logic is intended only as one example, and other arrangements will occur readily to one of ordinary skill in the art in view of the teachings herein.

Figure 8:
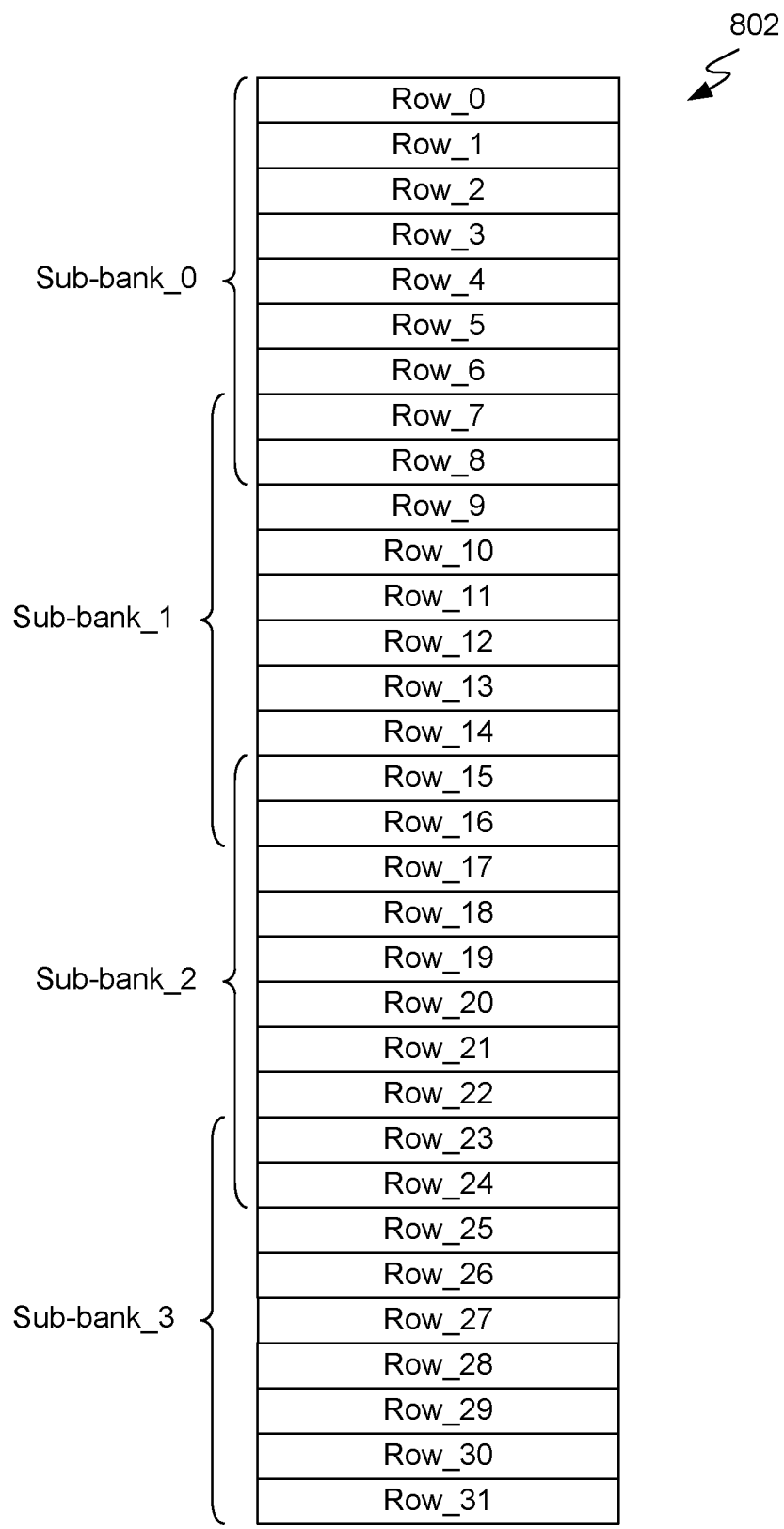
FIG. 8 illustrates a DRAM array organized in sub-banks, in accordance with exemplary embodiments.

As shown in FIG. 8, a DRAM array 802 may comprise any number of rows, such as, for example, 32 rows, which may be referenced in the illustrated example as Row_0, Row_1, Row_2, etc., through Row_31. The DRAM array 802 may represent one bank of a DRAM. Although not shown in FIG. 8, the DRAM bank represented by the DRAM array 802 may be one of multiple banks in a DRAM, as described above with regard to FIG. 2. Conceptually, the DRAM array 802 may be organized as a plurality of sub-banks, where each sub-bank comprises two or more rows. For example: a first sub-bank, Sub-bank_0, may comprise Row_0 through Row_8; a second sub-bank, Sub-bank_1, may comprise Row_7 through Row_16; a third sub-bank, Sub-bank_2, may comprise Row_15 through Row_24; and a fourth sub-bank, Sub-bank_3, may comprise Row_23 through Row_31. Note that the sub-banks overlap each other in the illustrated example: Row_7 and Row_8 are included in both Sub-bank_0 and Sub-bank_1; Row_15 and Row_16 are included in both Sub-bank_1 and Sub-bank_2; and Row_23 and Row_24 are included in both Sub-bank_2 and Sub-bank_3. That is, in the illustrated example two rows of each sub-bank overlap with two rows of another sub-bank. Nevertheless, in other examples more than two rows of each sub-bank may overlap with more than two rows of another sub-bank. For example, in a DRAM array (not shown) having at least 32 rows, 16 rows of each sub-bank may overlap with 16 rows of another sub-bank. In an example, a DRAM array (not shown) may have 8 k (i.e., 8192) rows organized as 256 sub-banks, each consisting of 32 rows, and 16 rows of each sub-bank may overlap with 16 rows of another sub-bank.

Figure 9:
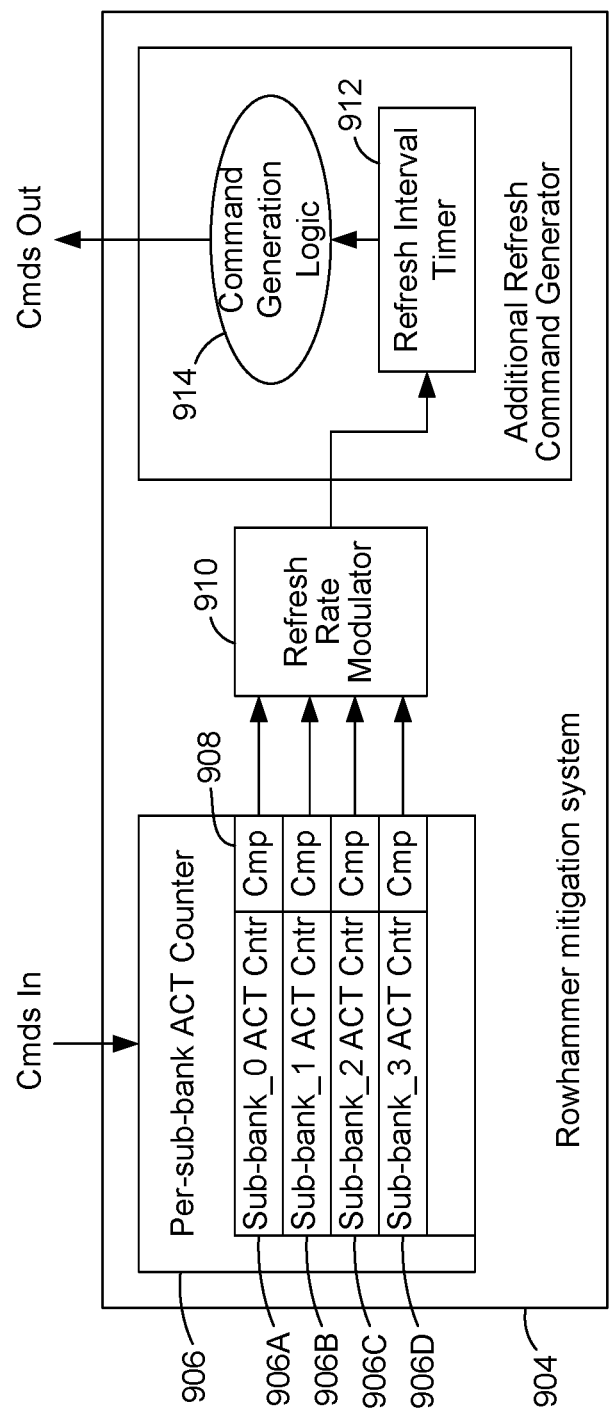
FIG. 9 is a block diagram illustrating a rowhammer mitigation system configured to count activation commands on a sub-bank basis, in accordance with exemplary embodiments.

As shown in FIG. 9, a rowhammer mitigation system 904 may be provided that is similar to the above-described rowhammer mitigation system 704 (FIG. 7) except that the rowhammer mitigation system 904 may include per-sub-bank ACT counter logic 906. The per-sub-bank ACT counter logic 906 may count row activation commands per sub-bank instead of per bank. For example, the per-sub-bank ACT counter logic 906 may include counters 906A, 906B, 906C and 906D, corresponding to the four sub-banks in the example shown in FIG. 8. Each counter 906A-906D maintains a count and increments the count when the ACT counter logic 906 detects a row activation command directed to a row of the corresponding sub-bank. Other elements of the rowhammer mitigation system 904 may be similar to the corresponding elements of the above-described rowhammer mitigation system 704. Accordingly, the comparator logic 908 may be configured to compare the count of activations directed to a sub-bank with a threshold. Likewise, the rowhammer mitigation system 904 may include a refresh rate modulator 910, a refresh interval timer 912, and command generation logic 914, all configured in the same manner described above with regard to the refresh rate modulator 710, the refresh interval timer 712, and the command generation logic 714 (FIG. 7), respectively. The rowhammer mitigation system 904 may be included in a memory controller portion (not shown in FIG. 9) as described above with regard to FIG. 7.

Correspondingly, in the above-described methods 300 (FIG. 3) and 500 (FIG. 5), the number of row activations that are counted (blocks 304 and 504) may be counted on a per-sub-bank basis. The number of row activations directed to each sub-bank within a refresh window may be counted and compared with a threshold (blocks 306 and 506).

Counting row activations on a per-sub-bank basis instead of a per-bank basis may improve performance in the benign case, i.e., when the memory system is not under attack. When the memory system is not under attack, there is a high probability that row activations are scattered across the bank rather than concentrated in proximity with a particular (victim) row. When row activations are scattered across the bank rather than concentrated, a larger number of counters will increment during the refresh window but at a lower rate than if the row accesses were concentrated.

Figure 10:
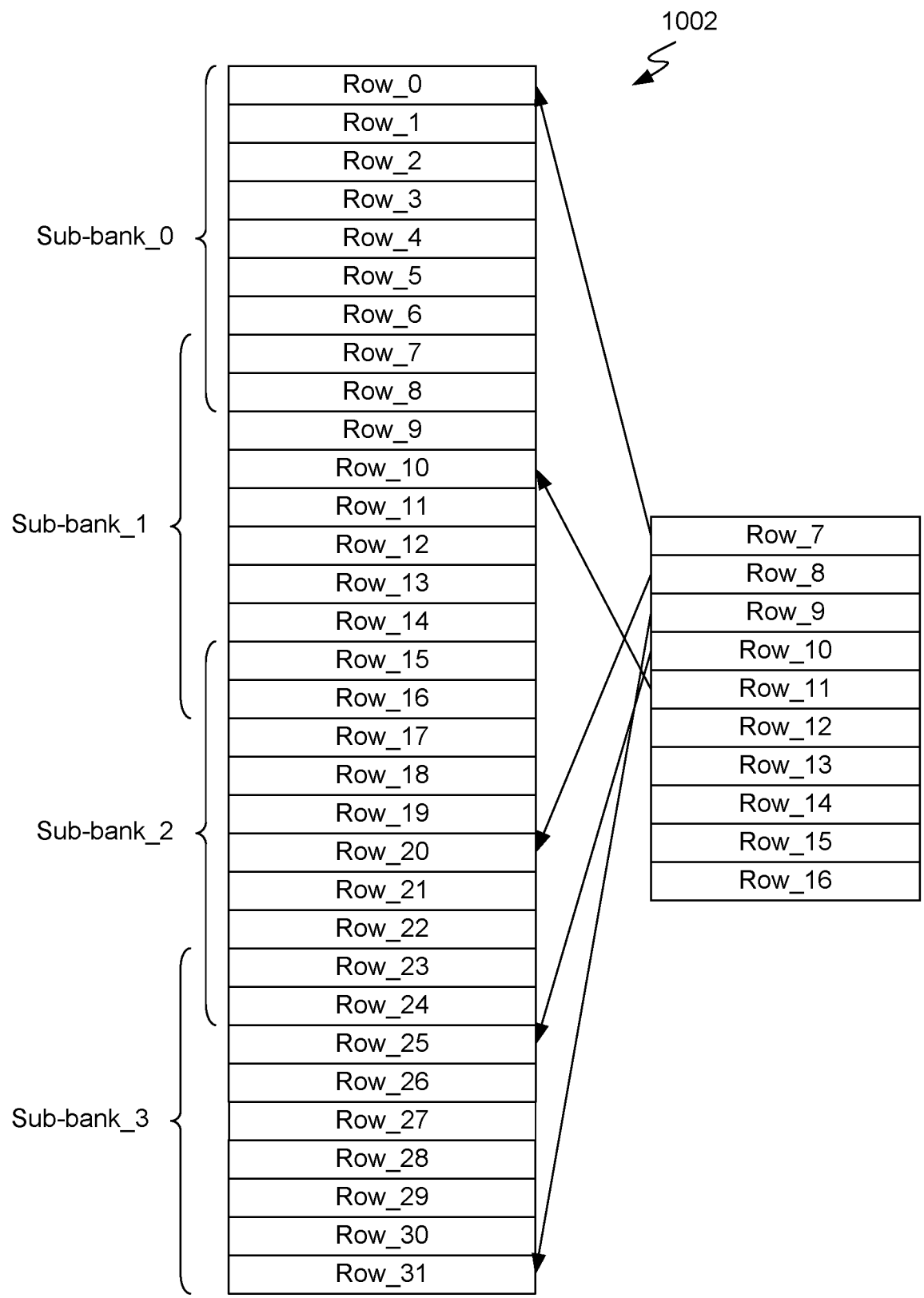
FIG. 10 illustrates row address hashing in a DRAM array organized in sub-banks, in accordance with exemplary embodiments.

As shown in FIG. 10, a DRAM array 1002 may be accessed using row hashing. As understood by one of ordinary skill in the art, "hashing" refers to applying a function to input data that produces output data of a fixed size. Another characteristic of a hashing function is that a small change in the input data results in a large change in the output data. Hashing has been used conventionally, for example, to spread memory accesses more evenly over multiple banks. In that use of hashing, the output of the hashing function is a bank address. In accordance with the present disclosure, methods for mitigating row hammering may include hashing (i.e., applying a hashing function to) the row address associated with each row activation command, and providing the resulting hashed row address to the DRAM array 1002 in association with the row activation command instead of the original (pre-hashing) row address. Hashing the row address may help spread the memory accesses over a greater number of rows. In examples in which the DRAM array is organized as sub-banks (as described above with regard to FIGS. 8-9), hashing the row address may help spread the memory accesses over a greater number of sub-banks.

In the example of row hashing shown in FIG. 10, various rows in Sub bank_1 (i.e., in the range Row_7 through Row_16) may be accessed. Each row access comprises a row activation command and an associated (original) row address. The original row address is provided as an input to a hashing function (not shown), which produces a hashed row address as an output. For example, as indicated by the arrows in FIG. 10, the hashing function may produce: a hashed row address of Row_0 in response to an original row address of Row_7; a hashed row address of Row_10 in response to an original row address of Row_11; a hashed row address of Row_20 in response to an original row address of Row_8; a hashed row address of Row_31 in response to an original row address of Row_9; a hashed row address of Row_25 in response to an original row address of Row_10; etc. Although only five row accesses are illustrated in FIG. 10, there may be any number, addressed to any row in any sub-bank. Note in the example shown in FIG. 10 that although all of the original row addresses are in Sub-bank_1, the hashed row addresses are spread among all of Sub-bank_0, Sub-bank_1, Sub-bank_2 and Sub-bank_3.

Figure 11:
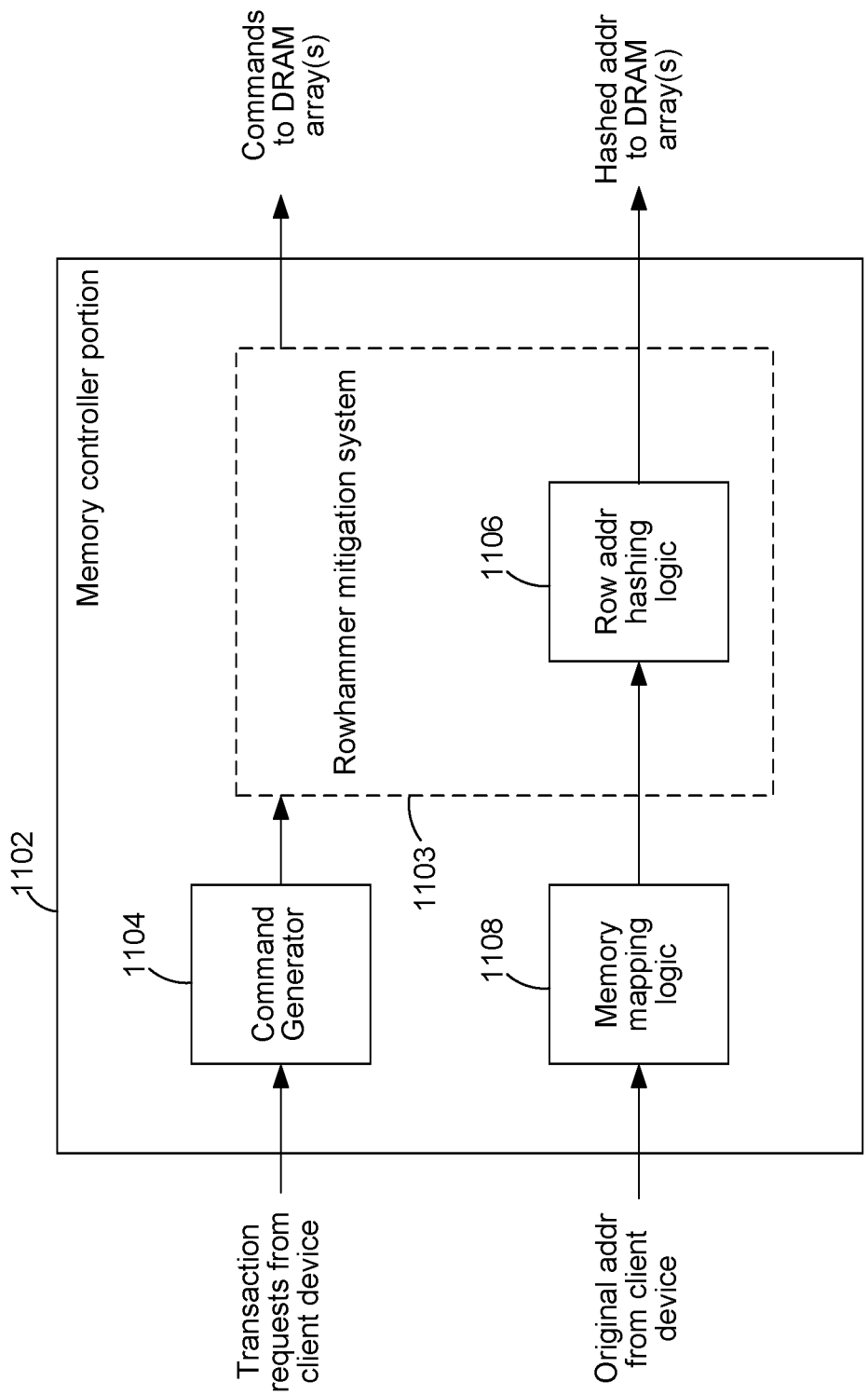
FIG. 11 is a block diagram illustrating a rowhammer mitigation system with row address hashing in a memory controller, in accordance with exemplary embodiments.

In FIG. 11 a memory controller portion 1102 that includes a rowhammer mitigation system 1103 is illustrated in block diagram form. The memory controller portion 1102 may include a command generator 1104, which may be similar to the above-described command generator 404 (FIG. 4) or 604 (FIG. 6). The rowhammer mitigation system 1103 of the memory controller portion 1102 may be similar to either the above-described rowhammer mitigation system 403 (FIG. 4), the above-described rowhammer mitigation system 603 (FIG. 6), or a combination of both. The rowhammer mitigation system 1103 may further include row hashing logic 1106, configured to apply a row hashing function to an original row address, resulting in a hashed row address. The original row address may be received from the client device (not shown in FIG. 11), either directly or via one or more intermediary elements, such as, for example, memory mapping logic 1108. The rowhammer mitigation system 1103 may be configured to provide hashed row addresses and associated row activation commands to the DRAM (not shown in FIG. 11). Although in the example illustrated in FIG. 11 the row address hashing logic 1106 is located after the output of the memory mapping logic 1108, in another example (not shown) such row address hashing logic 1106 may be located elsewhere in the memory controller portion 1102, such as before the memory mapping logic 1108 (which may translate the physical address in the transaction request to rank, bank, row, column, etc.), and may be configured to hash the physical address before the command generator 1104 generates any corresponding commands for the transaction request.

Figure 12:
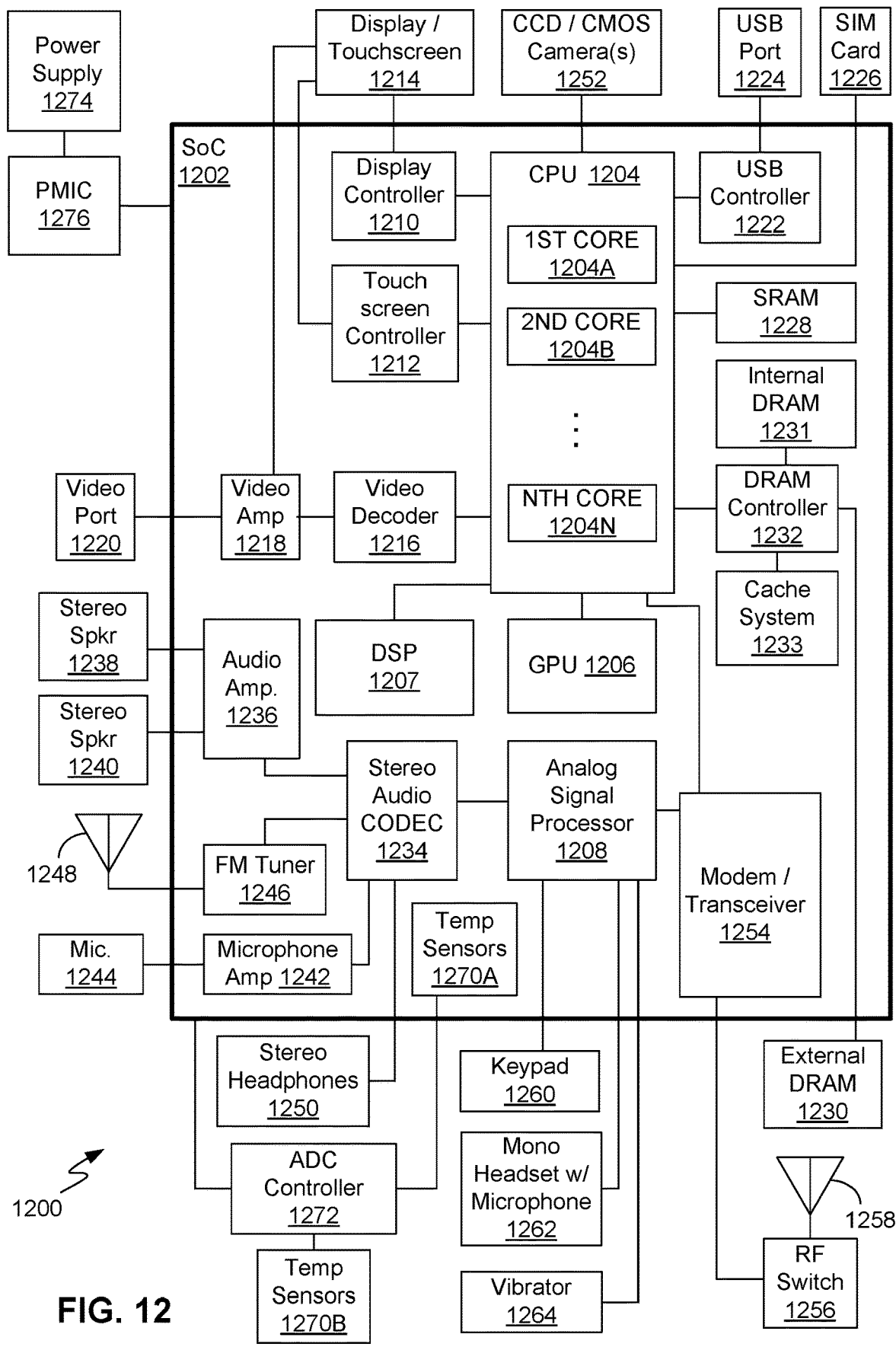
FIG. 12 is block diagram of a portable computing device, in accordance with exemplary embodiments.

FIG. 12 illustrates an example of a portable computing device ("PCD") 1200, in which exemplary embodiments of systems, methods, computer-readable media, and other examples of rowhammer mitigation solutions may be provided. The PCD 1200 may be, for example, a laptop or palmtop computer, cellular telephone or smartphone, personal digital assistant, navigation device, smartbook, portable game console, satellite telephone, etc. For purposes of clarity, some data buses, interconnects, signals, etc., are not shown in FIG. 12.

The PCD 1200 may include an SoC 1202. The SoC 1202 may include a central processing unit ("CPU") 1204, a graphics processing unit ("GPU") 1206, a digital signal processor ("DSP") 1207, an analog signal processor 1208, a modem/modem subsystem 1254, or other processors. The CPU 1204 may include one or more CPU cores, such as a first CPU core 1204A, a second CPU core 1204B, etc., through an Nth CPU core 1204N. The CPU 1204 or a portion thereof may be an example of the above-described client device 102 (FIG. 1) or 202 (FIG. 2).

A display controller 1210 and a touch-screen controller 1212 may be coupled to the CPU 1204. A touchscreen display 1214 external to the SoC 1202 may be coupled to the display controller 1210 and the touch-screen controller 1212. The PCD 1200 may further include a video decoder 1216 coupled to the CPU 1204. A video amplifier 1218 may be coupled to the video decoder 1216 and the touchscreen display 1214. A video port 1220 may be coupled to the video amplifier 1218. A universal serial bus ("USB") controller 1222 may also be coupled to CPU 1204, and a USB port 1224 may be coupled to the USB controller 1222. A subscriber identity module ("SIM") card 1226 may also be coupled to the CPU 1204.

One or more memories may be coupled to the CPU 1204. The one or more memories may include both volatile and non-volatile memories. Examples of volatile memories include static random access memory ("SRAM") 1228 and dynamic random access memory ("DRAM") 1230 and 1231. Such memories may be external to the SoC 1202, such as the DRAM 1230, or internal to the SoC 1202, such as the DRAM 1231. A DRAM controller 1232 coupled to the CPU 1204 may control the writing of data to, and reading of data from, the DRAMs 1230 and 1231. The DRAM controller 1232 may be an example of any of the above-described memory controllers 104 (FIG. 1) or 206 (FIG. 2). Accordingly, the DRAM controller 1232 may be configured (e.g., through software, firmware, hardware logic, etc.) to include any of the above-described memory controller portions 402 (FIG. 2), 602 (FIG. 6) or 1102 (FIG. 11), and to perform or control any of the above-described methods 300 (FIG. 3), 500 (FIG. 5) or other methods. The DRAM 1230 or 1231 may have a structure similar to the above-described DRAM 208 (FIG. 2).

A stereo audio CODEC 1234 may be coupled to the analog signal processor 1208. Further, an audio amplifier 1236 may be coupled to the stereo audio CODEC 1234. First and second stereo speakers 1238 and 1240, respectively, may be coupled to the audio amplifier 1236. In addition, a microphone amplifier 1242 may be coupled to the stereo audio CODEC 1234, and a microphone 1244 may be coupled to the microphone amplifier 1242. A frequency modulation ("FM") radio tuner 1246 may be coupled to the stereo audio CODEC 1234. An FM antenna 1248 may be coupled to the FM radio tuner 1246. Further, stereo headphones 1250 may be coupled to the stereo audio CODEC 1234. Other devices that may be coupled to the CPU 1204 include one or more digital (e.g., CCD or CMOS) cameras 1252.

The modem or RF transceiver 1254 may be coupled to the analog signal processor 1208 and the CPU 1204. An RF switch 1256 may be coupled to the RF transceiver 1254 and an RF antenna 1258. In addition, a keypad 1260, a mono headset with a microphone 1262, and a vibrator device 1264 may be coupled to the analog signal processor 1208.

The SoC 1202 may have one or more internal or on-chip thermal sensors 1270A and may be coupled to one or more external or off-chip thermal sensors 1270B. An analog-to-digital converter controller 1272 may convert voltage drops produced by the thermal sensors 1270A and 1270B to digital signals. A power supply 1274 and a power management integrated circuit ("PMIC") 1276 may supply power to the SoC 1202.

Firmware or software may be stored in any of the above-described memories, such as the DRAM 1230 or 1231, SRAM 1228, etc., or may be stored in a local memory directly accessible by the processor hardware on which the software or firmware executes. Execution of such firmware or software may control aspects of any of the above-described methods or configure aspects any of the above-described systems. Any such memory or other non-transitory storage medium having firmware or software stored therein in computer-readable form for execution by processor hardware may be an example of a "computer-readable medium," as the term is understood in the patent lexicon.

Implementation examples are described in the following numbered clauses.

1. A method, comprising:
   detecting row activation commands directed to a sub-bank of a plurality of sub-banks, each sub-bank comprising a plurality of rows of a bank of the DRAM array;
   counting a first number of the row activation commands occurring within a window between a first refresh command and a second refresh command;
   comparing the first number of row activation commands with a first threshold; and
   providing an additional refresh command to the DRAM array within the window in response to detecting the first number of row activation commands exceeds the first threshold.
2. The method of clause 1, wherein a plurality of rows of each sub-bank overlap with a plurality of rows of another sub-bank.
3. The method of clause 1 or 2, wherein at least 16 rows of each sub-bank overlap with at least 16 rows of another sub-bank.
4. The method of any of clauses 1-3, wherein the first and second refresh commands are consecutive.
5. The method of any of clauses 1-4, further comprising increasing a timing gap between successive commands provided to the DRAM array in response to detecting the first number of row activation commands exceeds the first threshold.
6. The method of clause 5, further comprising, after increasing the timing gap:
   counting a second number of row activation commands occurring within the window;
   comparing a sum of the first and second number of row activation commands with a second threshold; and
   further increasing the timing gap between successive commands provided to the DRAM array in response to detecting the sum of the first and second number of row activation commands exceeds the second threshold.
7. The method of any of clauses 1-6, further comprising hashing an original row address associated with each row activation command, and providing a hashed row address in association with the row activation command to the DRAM array instead of the original row address.
8. A system, comprising:
   command detection logic configured to detect row activation commands directed to a sub-bank of a plurality of sub-banks, each sub-bank comprising a plurality of rows of a bank of a DRAM array;
   activation command counting logic configured to count a first number of the row activation commands occurring within a window between a first refresh command and a second refresh command, and configured to compare the first number of row activation commands with a first threshold; and
   an additional refresh command generator configured to provide an additional refresh command to the DRAM array within the window in response to detecting the first number of row activation commands exceeds the first threshold.
9. The system of clause 8, wherein a plurality of rows of each sub-bank overlap with a plurality of rows of another sub-bank.
10. The system of clause 8 or 9, wherein at least 16 rows of each sub-bank overlap with at least 16 rows of another sub-bank.
11. The system of any of clauses 8-10, wherein the first and second refresh commands are consecutive.
12. The system of any of clauses 8-11, further comprising a timing controller configured to increase a timing gap between successive commands provided to the DRAM array in response to detecting the first number of row activation commands exceeds the first threshold.
13. The system of clause 12, wherein:
    the activation command counting logic is further configured to, after the timing gap is increased, count a second number of row activation commands occurring within the window; and
    the timing controller is further configured to compare a sum of the first and second number of row activation commands with a second threshold and to further increase the timing gap between successive commands provided to the DRAM array in response to detecting the sum of the first and second number of row activation commands exceeds the second threshold.
14. The system of any of clauses 8-13, further comprising row address hashing logic configured to hash an original row address associated with each row activation command, and provide a hashed row address in association with the row activation command to the DRAM array instead of the original row address.
15. A system, comprising:
    means for detecting row activation commands directed to a sub-bank of a plurality of sub-banks, each sub-bank comprising a plurality of rows of a bank of the DRAM array;
    means for counting a first number of the row activation commands occurring within a window between a first refresh command and a second refresh command and for comparing the first number of row activation commands with a first threshold; and
    means for providing an additional refresh command to the DRAM array within the window in response to detecting the first number of row activation commands exceeds the first threshold.
16. The system of clause 15, wherein a plurality of rows of each sub-bank overlap with a plurality of rows of another sub-bank.
17. The system of clause 15 or 16, wherein at least 16 rows of each sub-bank overlap with at least 16 rows of another sub-bank.
18. The system of any of clauses 15-17, wherein the first and second refresh commands are consecutive.
19. The system of any of clauses 15-18, further comprising means for increasing a timing gap between successive commands provided to the DRAM array in response to detecting the first number of row activation commands exceeds the first threshold.
20. The system of clause 19, further comprising, after increasing the timing gap:
    means for counting a second number of row activation commands occurring within the window;
    means for comparing a sum of the first and second number of row activation commands with a second threshold; and means for further increasing the timing gap between successive commands provided to the DRAM array in response to detecting the sum of the first and second number of row activation commands exceeds the second threshold.

21. The system of any of clauses 15-20, further comprising means for hashing an original row address associated with each row activation command, and providing a hashed row address in association with the row activation command to the DRAM array instead of the original row address.

22. A memory controller, comprising:
command generator logic configured to generate dynamic random access memory (DRAM) commands in response to memory transaction requests, the DRAM commands including row activation commands and refresh commands;
command detection logic configured to detect row activation commands directed to a sub-bank of a plurality of sub-banks, each sub-bank comprising a plurality of rows of a bank of a DRAM array;
activation command counting logic configured to count a first number of the row activation commands occurring within a window between a first refresh command and a second refresh command, and configured to compare the first number of row activation commands with a first threshold; and
an additional refresh command generator configured to provide an additional refresh command to the DRAM array within the window in response to detecting the first number of row activation commands exceeds the first threshold.

23. The memory controller of clause 22, wherein a plurality of rows of each sub-bank overlap with a plurality of rows of another sub-bank.

24. The memory controller of clause 22 or 23, wherein the first and second refresh commands are consecutive.

25. The memory controller of any of clauses 22-24, further comprising a timing controller configured to increase a timing gap between successive commands provided to the DRAM array in response to detecting the first number of row activation commands exceeds the first threshold.

26. The memory controller of any of clauses 22-25, further comprising row address hashing logic configured to hash an original row address associated with each row activation command, and provide a hashed row address in association with the row activation command to the DRAM array instead of the original row address.

Alternative embodiments will become apparent to one of ordinary skill in the art to which the invention pertains. Therefore, although selected aspects have been illustrated and described in detail, it will be understood that various substitutions and alterations may be made therein.

What is claimed is:

1. A method, comprising:
detecting row activation commands directed to a sub-bank of a plurality of sub-banks, each sub-bank comprising a plurality of rows of a bank of the DRAM array;
counting a first number of the row activation commands occurring within a window between a first refresh command and a second refresh command;
comparing the first number of row activation commands with a first threshold, the first threshold comprising a predetermined number associated with refresh operations required to refresh all rows of a bank; and
providing an additional refresh command to the DRAM array within the window in response to detecting the first number of row activation commands exceeds the first threshold.

2. The method of claim 1, wherein a plurality of rows of each sub-bank overlap with a plurality of rows of another sub-bank.

3. The method of claim 2, wherein at least 16 rows of each sub-bank overlap with at least 16 rows of another sub-bank.

4. The method of claim 1, wherein the first and second refresh commands are consecutive.

5. The method of claim 1, further comprising increasing a timing gap between successive commands provided to the DRAM array in response to detecting the first number of row activation commands exceeds the first threshold.

6. The method of claim 5, further comprising, after increasing the timing gap:
counting a second number of row activation commands occurring within the window;
comparing a sum of the first and second number of row activation commands with a second threshold; and
further increasing the timing gap between successive commands provided to the DRAM array in response to detecting the sum of the first and second number of row activation commands exceeds the second threshold.

7. The method of claim 1, further comprising hashing an original row address associated with each row activation command, and providing a hashed row address in association with the row activation command to the DRAM array instead of the original row address.

8. A system, comprising:
command detection logic configured to detect row activation commands directed to a sub-bank of a plurality of sub-banks, each sub-bank comprising a plurality of rows of a bank of a DRAM array;
activation command counting logic configured to count a first number of the row activation commands occurring within a window between a first refresh command and a second refresh command, and configured to compare the first number of row activation commands with a first threshold, the first threshold comprising a predetermined number associated with refresh operations required to refresh all rows of a bank; and
an additional refresh command generator configured to provide an additional refresh command to the DRAM array within the window in response to detecting the first number of row activation commands exceeds the first threshold.

9. The system of claim 8, wherein a plurality of rows of each sub-bank overlap with a plurality of rows of another sub-bank.

10. The system of claim 9, wherein at least 16 rows of each sub-bank overlap with at least 16 rows of another sub-bank.

11. The system of claim 8, wherein the first and second refresh commands are consecutive.

12. The system of claim 8, further comprising a timing controller configured to increase a timing gap between successive commands provided to the DRAM array in response to detecting the first number of row activation commands exceeds the first threshold.

13. The system of claim 12, wherein:
the activation command counting logic is further configured to, after the timing gap is increased, count a second number of row activation commands occurring within the window; and the timing controller is further configured to compare a sum of the first and second number of row activation commands with a second threshold and to further increase the timing gap between successive commands provided to the DRAM array in response to detecting the sum of the first and second number of row activation commands exceeds the second threshold.

14. The system of claim 8, further comprising row address hashing logic configured to hash an original row address associated with each row activation command, and provide a hashed row address in association with the row activation command to the DRAM array instead of the original row address.

15. A system, comprising:
   means for detecting row activation commands directed to a sub-bank of a plurality of sub-banks, each sub-bank comprising a plurality of rows of a bank of the DRAM array;
   means for counting a first number of the row activation commands occurring within a window between a first refresh command and a second refresh command and for comparing the first number of row activation commands with a first threshold the first threshold comprising a predetermined number associated with refresh operations required to refresh all rows of a bank; and
   means for providing an additional refresh command to the DRAM array within the window in response to detecting the first number of row activation commands exceeds the first threshold.

16. The system of claim 15, wherein a plurality of rows of each sub-bank overlap with a plurality of rows of another sub-bank.

17. The system of claim 16, wherein at least 16 rows of each sub-bank overlap with at least 16 rows of another sub-bank.

18. The system of claim 15, wherein the first and second refresh commands are consecutive.

19. The system of claim 15, further comprising means for increasing a timing gap between successive commands provided to the DRAM array in response to detecting the first number of row activation commands exceeds the first threshold.

20. The system of claim 19, further comprising, after increasing the timing gap:
   means for counting a second number of row activation commands occurring within the window;
   means for comparing a sum of the first and second number of row activation commands with a second threshold; and
   means for further increasing the timing gap between successive commands provided to the DRAM array in response to detecting the sum of the first and second number of row activation commands exceeds the second threshold.

21. The system of claim 15, further comprising means for hashing an original row address associated with each row activation command, and providing a hashed row address in association with the row activation command to the DRAM array instead of the original row address.

22. A memory controller, comprising:
   command generator logic configured to generate dynamic random access memory (DRAM) commands in response to memory transaction requests, the DRAM commands including row activation commands and refresh commands;
   command detection logic configured to detect row activation commands directed to a sub-bank of a plurality of sub-banks, each sub-bank comprising a plurality of rows of a bank of a DRAM array;
   activation command counting logic configured to count a first number of the row activation commands occurring within a window between a first refresh command and a second refresh command, and configured to compare the first number of row activation commands with a first threshold, the first threshold comprising a predetermined number associated with refresh operations required to refresh all rows of a bank; and
   an additional refresh command generator configured to provide an additional refresh command to the DRAM array within the window in response to detecting the first number of row activation commands exceeds the first threshold.

23. The memory controller of claim 22, wherein a plurality of rows of each sub-bank overlap with a plurality of rows of another sub-bank.

24. The memory controller of claim 22, wherein the first and second refresh commands are consecutive.

25. The memory controller of claim 22, further comprising a timing controller configured to increase a timing gap between successive commands provided to the DRAM array in response to detecting the first number of row activation commands exceeds the first threshold.

26. The memory controller of claim 22, further comprising row address hashing logic configured to hash an original row address associated with each row activation command, and provide a hashed row address in association with the row activation command to the DRAM array instead of the original row address.

* * * * *